United States Patent
Chen et al.

(10) Patent No.: US 7,701,038 B2
(45) Date of Patent: Apr. 20, 2010

(54) HIGH-GAIN VERTEX LATERAL BIPOLAR JUNCTION TRANSISTOR

(75) Inventors: Shuo-Mao Chen, Hsinchu (TW);
Chih-Ping Chao, Hsin-Chu (TW);
Chih-Sheng Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 259 days.

(21) Appl. No.: 11/589,478

(22) Filed: Oct. 30, 2006

(65) Prior Publication Data

US 2007/0105301 A1 May 10, 2007

Related U.S. Application Data

(60) Provisional application No. 60/731,720, filed on Oct. 31, 2005.

(51) Int. Cl.
*H01L 21/8249* (2006.01)
*H01L 21/331* (2006.01)
*H01L 21/70* (2006.01)
*H01L 21/02* (2006.01)

(52) U.S. Cl. .................. 257/593; 257/197; 257/198; 257/378; 257/557; 257/565; 257/578; 257/E29.187; 438/128; 438/170; 438/189; 438/202; 438/203; 438/204; 438/207; 438/234; 438/364; 326/75; 326/124

(58) Field of Classification Search .............. 438/170, 438/189, 202, 203, 204, 207, 128, 364, 334; 257/575, 378, 197, 198, 593, 557, 565, 578, 257/E29.187; 326/75, 124

See application file for complete search history.

(56) References Cited

U.S. PATENT DOCUMENTS 4,344,081 A 8/1982 Pao et al.
4,417,265 A * 11/1983 Murkland et al. ........... 257/560
4,669,177 A 6/1987 D'Arrigo et al.

(Continued)

OTHER PUBLICATIONS

Main Title: Analogue IC design : the current-mode approach. Edited by: C. Toumazou, F.J. Lidgey & D.G. Haigh. Published/Created: London, U.K. : Peregrinus on behalf of the Institution of Electrical Engineers, c1990. Pages used: 504-505.*

(Continued)

*Primary Examiner*—Fernando L Toledo
*Assistant Examiner*—John P Dulka
(74) *Attorney, Agent, or Firm*—Slater & Matsil, L.L.P.

(57) ABSTRACT

A lateral bipolar junction transistor having improved current gain and a method for forming the same are provided. The transistor includes a well region of a first conductivity type formed over a substrate, at least one emitter of a second conductivity type opposite the first conductivity type in the well region wherein each of the at least one emitters are interconnected, a plurality of collectors of the second conductivity type in the well region wherein the collectors are interconnected to each other, and a plurality of base contacts of the first conductivity type in the well region wherein the base contacts are interconnected to each other. Preferably, all sides of the at least one emitters are adjacent the collectors, and none of the base contacts are adjacent the sides of the emitters. The neighboring emitter, collectors and base contacts are separated by spacings in the well region.

20 Claims, 14 Drawing Sheets

U.S. PATENT DOCUMENTS

| | | | | |
|---|---|---|---|---|
| 4,672,414 | A | * | 6/1987 | Gabriel et al. .............. 257/191 |
| 4,800,415 | A | | 1/1989 | Simmons et al. |
| 4,831,281 | A | * | 5/1989 | Miller ........................ 327/577 |
| 5,498,885 | A | | 3/1996 | Deen et al. |
| 5,717,241 | A | * | 2/1998 | Malhi et al. ................. 257/378 |
| 5,717,724 | A | | 2/1998 | Yamazaki et al. |
| 7,015,089 | B2 | | 3/2006 | Hsu et al. |
| 2002/0096713 | A1 | * | 7/2002 | Magnee et al. .............. 257/341 |
| 2003/0062539 | A1 | * | 4/2003 | Chatterjee .................. 257/199 |
| 2004/0092070 | A1 | * | 5/2004 | Hsu et al. ................... 438/241 |

OTHER PUBLICATIONS

Main Title: The art of analog layout. Author: Alan Hastings. Published/Created: Upper Saddle River, NJ: Prentice Hall, c2001. p. 64.*

Author: IBM TDB; Cullet, R Title: Multicollector Lateral PNP Transistor IP.com No. IPCOM000083560D Original Publication Date: Jun. 1, 1975.*

Sankaran Aniruddhan, Min Chu, David J. Allstot; A lateral-bjt-biased cmos voltage-controlled oscillator, IEEE 2004; p. 967-979.*

Aniruddhan, S., et al., "A Lateral-BJT-Biased CMOS Voltage-Controlled Oscillator," 2004 IEEE, ISCAS, pp. 976-979.

Kook, Y.-J., et al., "P1.10: A new CMOS pixel with lateral and vertical BJT structure," 2002 IEEE, pp. 162-165.

Gomez, R., et al., "Lateral Bipolar Transistor Fabricated on a Deep-Submicron Technology," 1999 IEEE, pp. 37-42.

Yamada, T., et al., "A Novel High-Performance Lateral BJT on SOI with Metal-backed Single-Silicon External Base for Low-Power/Low-Cost RF Applications," 1999 IEEE, BCTM8.1, pp. 129-132.

Verdonckt-Vandebroek, S., et al., "High Gain Lateral Bipolar Transistor," 1988 IEEE, IEDM 88, pp. 406-409.

* cited by examiner

HIGH-GAIN VERTEX LATERAL BIPOLAR JUNCTION TRANSISTOR

This application claims priority to provisionally filed U.S. Patent Application No. 60/731,720, filed Oct. 31, 2005, entitled "A Novel High-Gain Vertex Lateral-BJT," which patent application is incorporated herein by reference.

TECHNICAL FIELD

This invention relates generally to semiconductor devices, and more particularly to the structure and fabrication methods of lateral bipolar junction transistors.

BACKGROUND

Bipolar junction transistors (BJTs) are key parts of analog integrated circuits. BJTs can be grouped as NPN BJTs (NBJTs) and PNP BJTs (PBJTs). A symbol for an NPN BJT, which comprises a collector C, a base B, and an emitter E, is shown in FIG. 1A. There are two types of commonly designed BJTs using conventional CMOS technology. FIGS. 1B and 1C illustrate a vertical-BJT, wherein a top view is shown in FIG. 1B and a cross-sectional view is shown in FIG. 1C. The vertical-BJT is an NPN transistor comprising doped regions, namely an emitter E, a base B and a collector C. To enhance emitter injection efficiency, the emitter E is enclosed by the base contact B and the collector C. The emitter E and the base contact B are formed in a P-well and the collector C is formed in an N-well, wherein the P-well and the N-well are further formed on a deep N-well (DNW). Since the base regions include the P-well and the base contact B, the emitter/base junction and the collector/base junction are formed between vertically located components, and the respective BJT is referred to as a vertical BJT.

FIGS. 1D and 1E illustrate a (NPN) lateral-BJT. Again, a top view is shown in FIG. 1D and a cross-sectional view is shown in FIG. 1E. Since the P-well, which is part of the base region, has a portion inserted between the emitter E and the collector C, the emitter/base junction and the collector/base junction are formed between laterally located components, and the respective BJT is referred to as a lateral-BJT (LBJT).

The ability for improving the gain of conventional vertical-BJTs and lateral-BJTs is limited for the following reasons. Using FIG. 1E as an example, besides the intentionally formed BJT, there is also a parasitic transistor NBJT, whose collector, base and emitter are formed by the region E, the P-well and the deep N-well (DNW), respectively. Since a significant portion of the emitter/base junction of the parasitic transistor NBJT is located at a surface 2, which is located at the bottom of the emitter E, to reduce the effect of the parasitic transistor NBJT, it is preferred that the surface 2 has a small area. On the other hand, in order to improve the emitter injection efficiency of the lateral-BJT, it is preferred that the path between the emitter E and collector C, which is symbolized by arrows 4, has a large area. This requires the length LE of the emitter E and collector C to have a great value. Great length LE and small area of the emitter E are conflicting requirements, which means that the improvement of the lateral-BJT comes with the cost of greater parasitic BJT. A dilemma for conventional vertical-BJTs is that the base width, which is substantially equal to a depth of the P-well as shown in FIG. 1C, is not scalable, if the vertical-BJTs are formed using a same technology as the formation of CMOS devices.

Conventionally, the BJTs are formed using conventional CMOS technology, and are typically formed simultaneously with the formation of CMOS devices. This incurs drawbacks. CMOS devices often have pocket implants, and thus the same pocket implants are performed on BJTs. The pocket implants result in the increase in the dosage in the base regions, hence decrease in current gain. Furthermore, the lightly-doped source/drain (LDD) implants causes sharp dose profile at base/collector junctions, resulting in lower breakdown voltages.

Therefore, there is the need for improving the gain of lateral-BJTs, the scalability of the respective base widths, and the emitter injection efficiency, without the cost of an increase in parasitic effects.

SUMMARY OF THE INVENTION

In accordance with one aspect of the present invention, a lateral bipolar junction transistor includes a well region (base region of the BJT) of a first conductivity type formed over a substrate, an emitter, a plurality of collectors and a plurality of base contacts in the well region. The emitter is of a second conductivity type opposite the first conductivity type, and has a polygon shape with a plurality of sides. The collectors are of the second conductivity type and are interconnected, wherein each one of the plurality of sides of the emitter has a collector adjacent and substantially aligned with one of the collectors. The base contacts are of the first conductivity type and are interconnected to each other. Preferably, the base contacts are adjacent the collectors, and none of the base contacts is adjacent or substantially aligned with a side of the emitter. The neighboring emitter and neighboring collectors and base contacts are separated by spacings in the well region.

In accordance with another aspect of the present invention, a lateral bipolar junction transistor includes a well region (base region of the BJT) of a first conductivity type formed over a substrate, at least one emitter of a second conductivity type opposite the first conductivity type in the well region, wherein each of the at least one emitters are interconnected, a plurality of collectors of the second conductivity type in the well region wherein the collectors are interconnected to each other, and a plurality of base contacts of the first conductivity type in the well region wherein the base contacts are interconnected to each other. Each of the at least one emitters is surrounded by the collectors. Preferably, none of the base contacts are adjacent a side of the at least one emitters. The emitter and neighboring collectors are separated by spacings in the well region, and the collectors and neighboring base contacts are separated by spacings in the well region.

In accordance with yet another aspect of the present invention, an array-shaped lateral bipolar junction transistor includes a well region (base region of the BJT) of a first conductivity type formed over a substrate, a plurality of emitters of a second conductivity type opposite the first conductivity type in the well region wherein the emitters are arranged in rows and columns and are interconnected, a plurality of collectors of the second conductivity type in the well region wherein the collectors are interconnected, a plurality of base contacts of the first conductivity type in the well region wherein the base contacts are interconnected to each other. All sides of each of the emitters are adjacent the collectors and are not adjacent the base contacts. Neighboring emitters, collectors and base contacts are separated by respective spacings in the well region.

In accordance with yet another aspect of the present invention, a method for forming a lateral bipolar junction transistor includes providing a substrate, forming a well region (base region of the BJT) over the substrate, forming a mask over the well region wherein the mask divides the well region into sub regions, implanting an emitter in one of the sub regions wherein the emitter is of a second conductivity type opposite the first conductivity type, implanting a portion of the sub regions adjacent the sides of the emitter to form a plurality of collectors, and implanting a portion of the sub regions not adjacent the sides of the emitter to form a plurality of base contacts.

The preferred embodiments of the present invention have improved current gain due to small emitter size, which reduces the parasitic effects of vertical-BJTs and increases direct emitter-to-collector path.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel design of lateral bipolar junction transistors (LBJT) with improved current gain is provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

In order to design a high current-gain LBJT, several principles are preferably applied. The base width, which is the distance in the base region separating an emitter and a collector, is preferably minimized. The emitter size is preferably minimized to lower vertical parasitic transistor effects. The lateral path between the emitter and the collector preferably has a maximized area in order to enhance emitter injection efficiency. The distance between the emitter and the base is preferably not too large, so that the base resistance is limited. These principles often conflict with each other, and thus the current gain is difficult to improve. A novel design following these principles is provided by the preferred embodiments of the present invention.

Figure 1A:
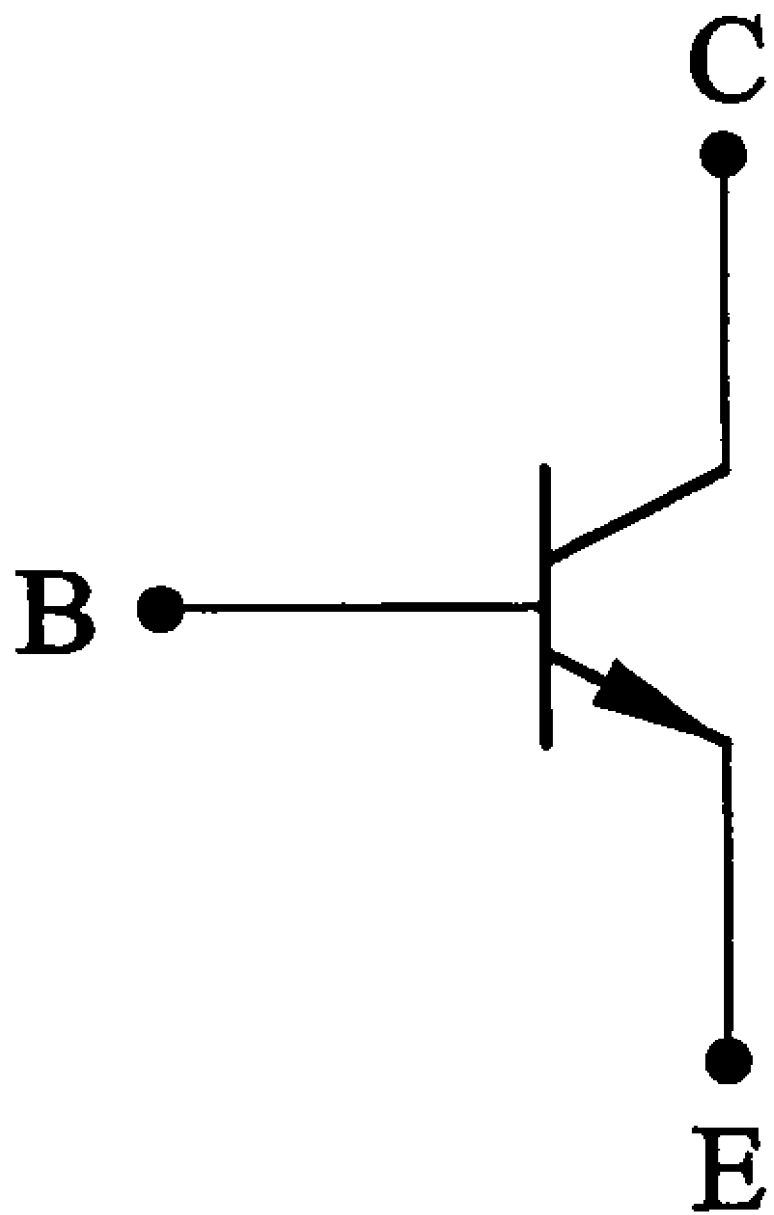
FIG. 1A illustrates a symbol of an NPN transistor.
Figure 1B:
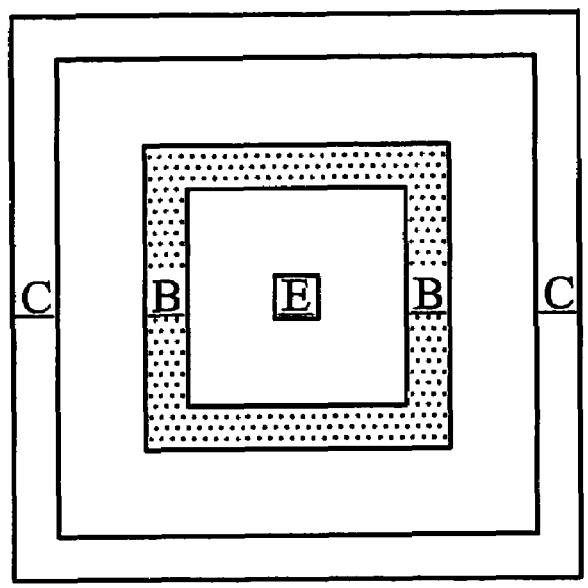
FIGS. 1B and 1C illustrate a conventional vertical bipolar junction transistor (BJT) formed using a conventional CMOS technology.
Figure 1C:
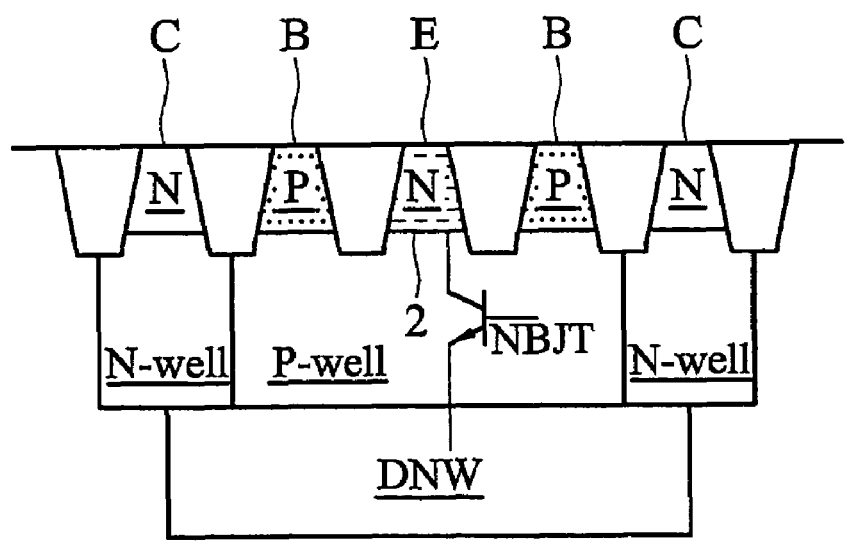
Figure 1D:
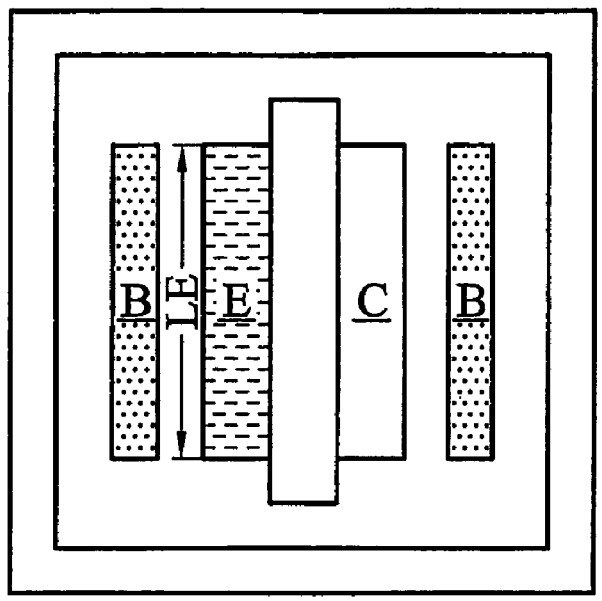
FIGS. 1D and 1E illustrate a conventional lateral bipolar junction transistor (BJT) formed using a conventional CMOS technology.
Figure 1E:
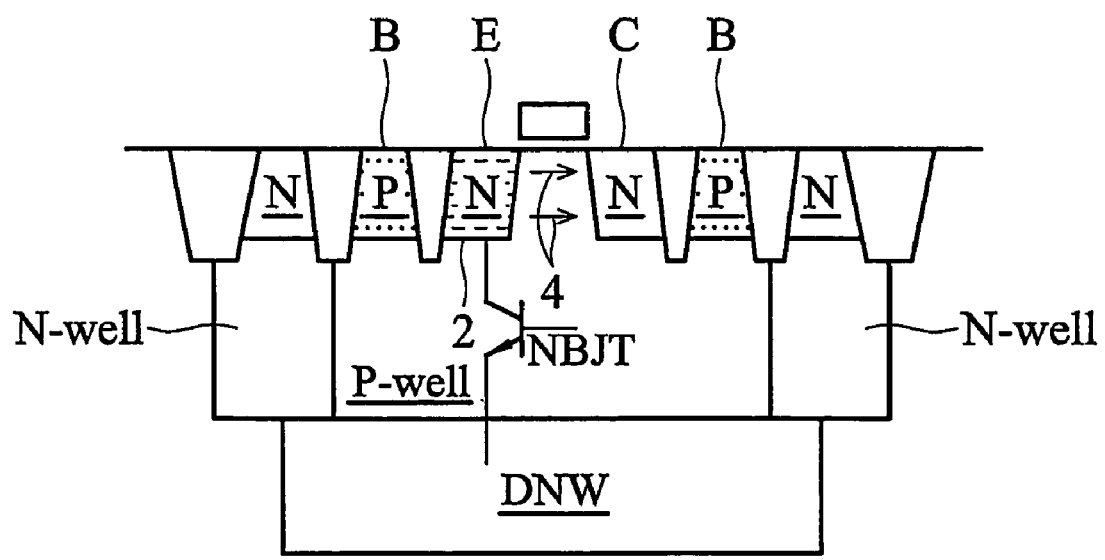
Figure 2A:
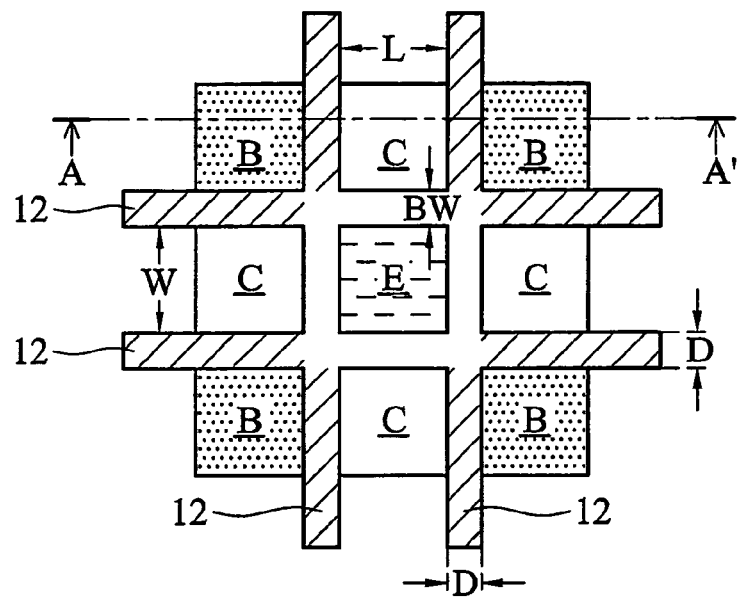
FIGS. 2A through 3B illustrate various unit BJT cells.
Figure 2B:
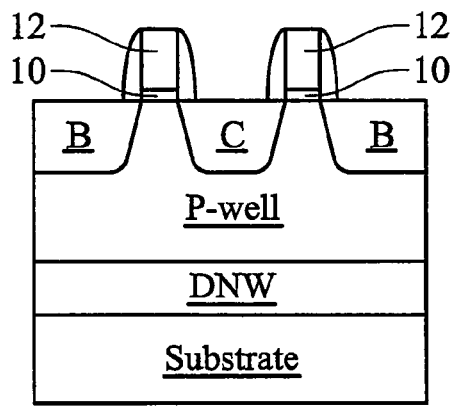

A unit NPN BJT (NBJT) cell is shown in FIG. 2A, which includes collectors C, base contacts B, and an emitter E at the center (also referred to as the vertex) of the unit cell. A cross-sectional view of the structure is shown in FIG. 2B, wherein the cross-sectional view is taken along a line A-A' in FIG. 2A. Preferably, the emitter E, collectors C and base contacts B are formed in a P-well, which is in turn on a deep N-well (DNW), and the DNW is further on a p-type substrate. Throughout the description, the base contact B is equally referred to as base B. One skilled in the art will realize that the base region includes both base contact B and the underlying P-well region (refer to FIG. 2B). A mask is preferably formed on the P-well, separating collectors C, base contacts B and emitter E. The mask preferably includes a dielectric layer 10 on the P-well, and a polysilicon 12 on the dielectric layer 10. The polysilicon 12 is preferably doped, and a voltage can be applied thereon to change the characteristics of the resulting BJT.

Figure 2C:
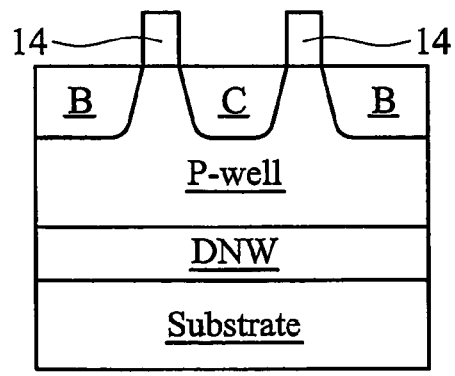

FIG. 2C illustrates a cross-sectional view of a variation of the structure shown in FIG. 2A, wherein a resist protective oxide (RPO) 14 is formed as the mask on the P-well. Although the RPO 14 cannot be used for applying a voltage, it is used for isolating the subsequently formed silicide regions on the emitter E, collectors C and base contacts B from contacting each other.

The base contacts B are located at the vertex of the emitter E. Preferably, the length L and width W (refer to FIG. 2A) of the emitter E is small, and more preferably substantially close to the minimum width allowed by the existing technology, or in other words, substantially close to the critical dimension. The emitter preferably has the shape of a polygon, such as triangle, rectangle or hexagon. Collectors C are preferably formed neighboring each side of the emitter E. Preferably, no base contact B is formed neighboring the sides of the emitter E. All collectors C are interconnected and act as one collector, and all base contacts B are interconnected and act as one base. Accordingly, the unit cell shown in FIG. 2A acts as one BJT.

With such a design, the previously discussed principles are applied and the current gain of the resulting BJT is improved. Note that the base width BW, which is the spacing between collector C and emitter E, may be scaled to the minimum width (un-shaded spacing in FIG. 2A), while the scaling of width D, which is the width of the shaded spacing in FIG. 2A, is optional. The emitter E is small because the length L and width W can be reduced to the minimum width. Since all the sides of the emitter E are adjacent collectors C, the path between the emitter E and the collectors C have a relatively great area.

Figure 3A:
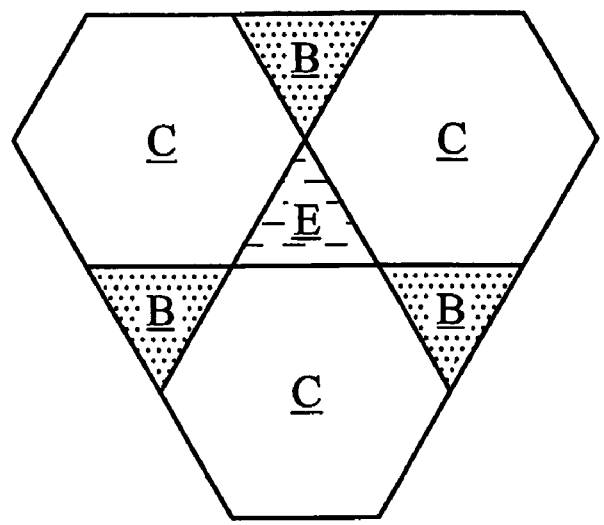
Figure 3B:
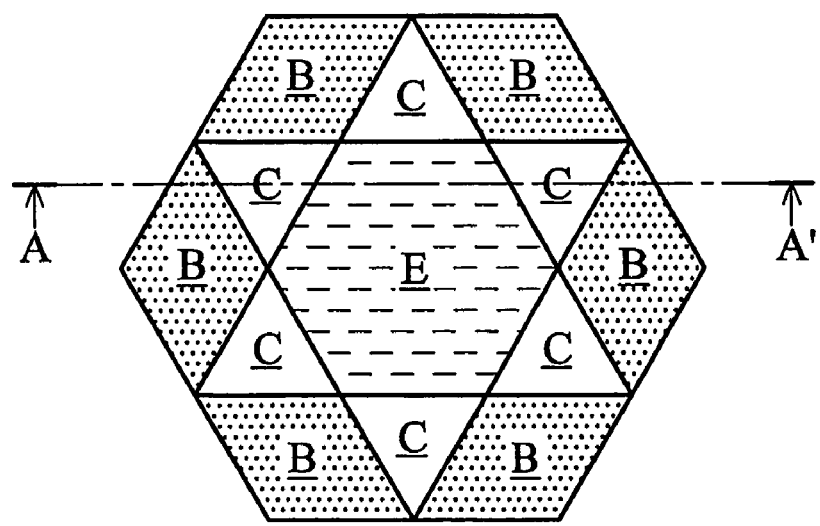
Figure 9:
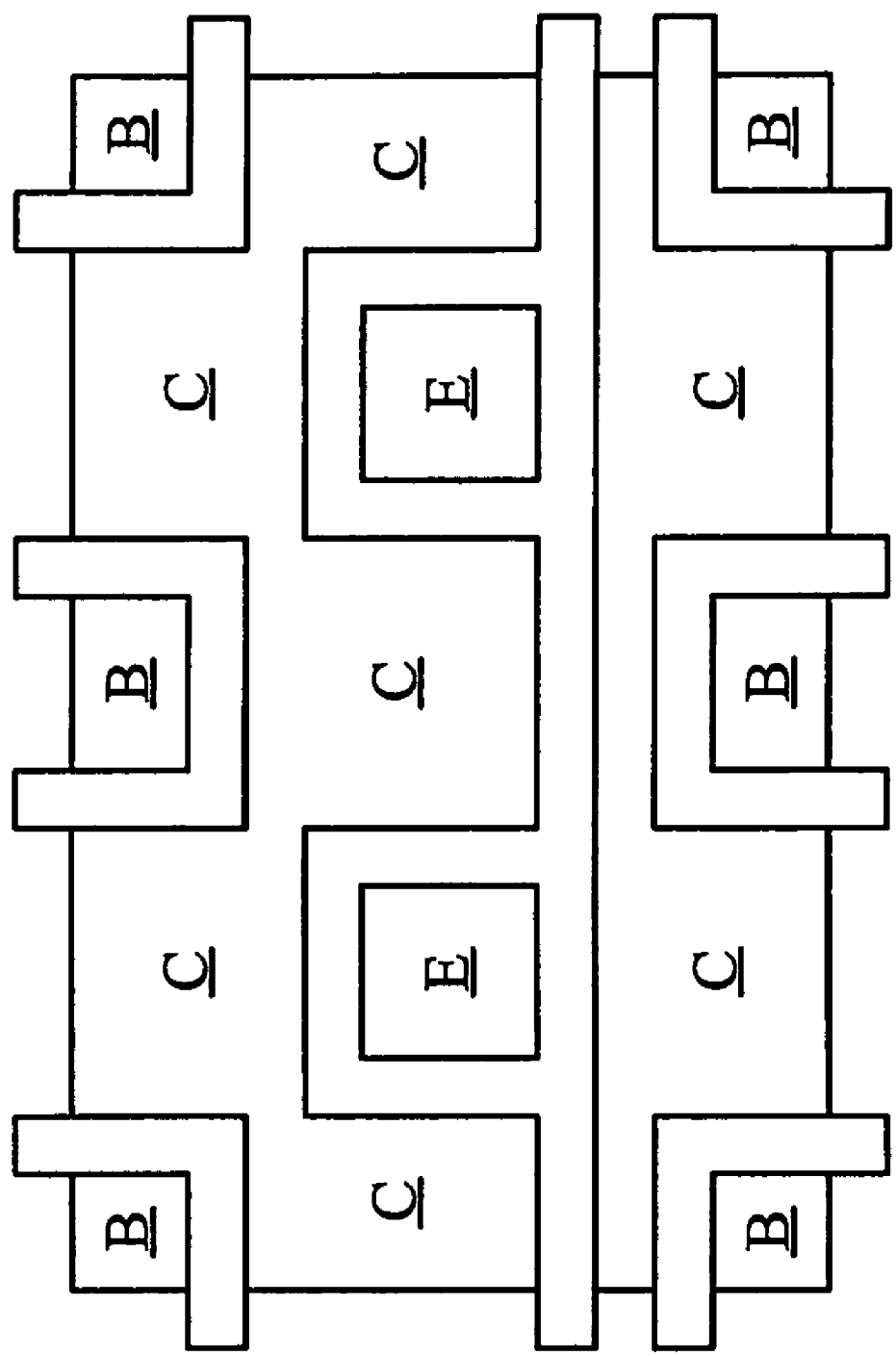
FIG. 9 illustrates a BJT embodiment, wherein emitters are separated from base contacts by collectors.

FIGS. 3A and 3B are variations of the preferred embodiment of the present invention, and these variations have the following common features: the emitter E is located at the center of the unit cell; all sides of the emitter E are neighbored by collectors C; the bases B are located closely to the emitter E, but no base B is adjacent the sides of the emitter E. In the preferred embodiment, no collector C is located between an emitter E and a base B. In other embodiments, as shown in FIG. 9, an emitter and a base B may be separated by a collector C. For simplicity, poly strips or RPO regions between neighboring emitters, collectors and base contacts are not shown, although they are preferably present between all the neighboring features E, B and C. It is appreciated that although the emitters, collectors and bases preferably have regular shapes for the convenience of layout, they can have irregular shapes, and the irregularity includes sides with unequal lengths, curved sides, etc.

In FIG. 3A, an emitter E is a triangle, and collectors C and base contacts B are hexagons and triangles, respectively. In FIG. 3B, an emitter E has a hexagonal shape, while collectors C have triangular shapes, bases B have diamond shapes. It is to be noted that the preferred embodiments of the present invention do not govern the relationship between the shapes of the emitters, collectors and base contacts, except that the above-discussed design principles are preferably applied.

Figure 4:
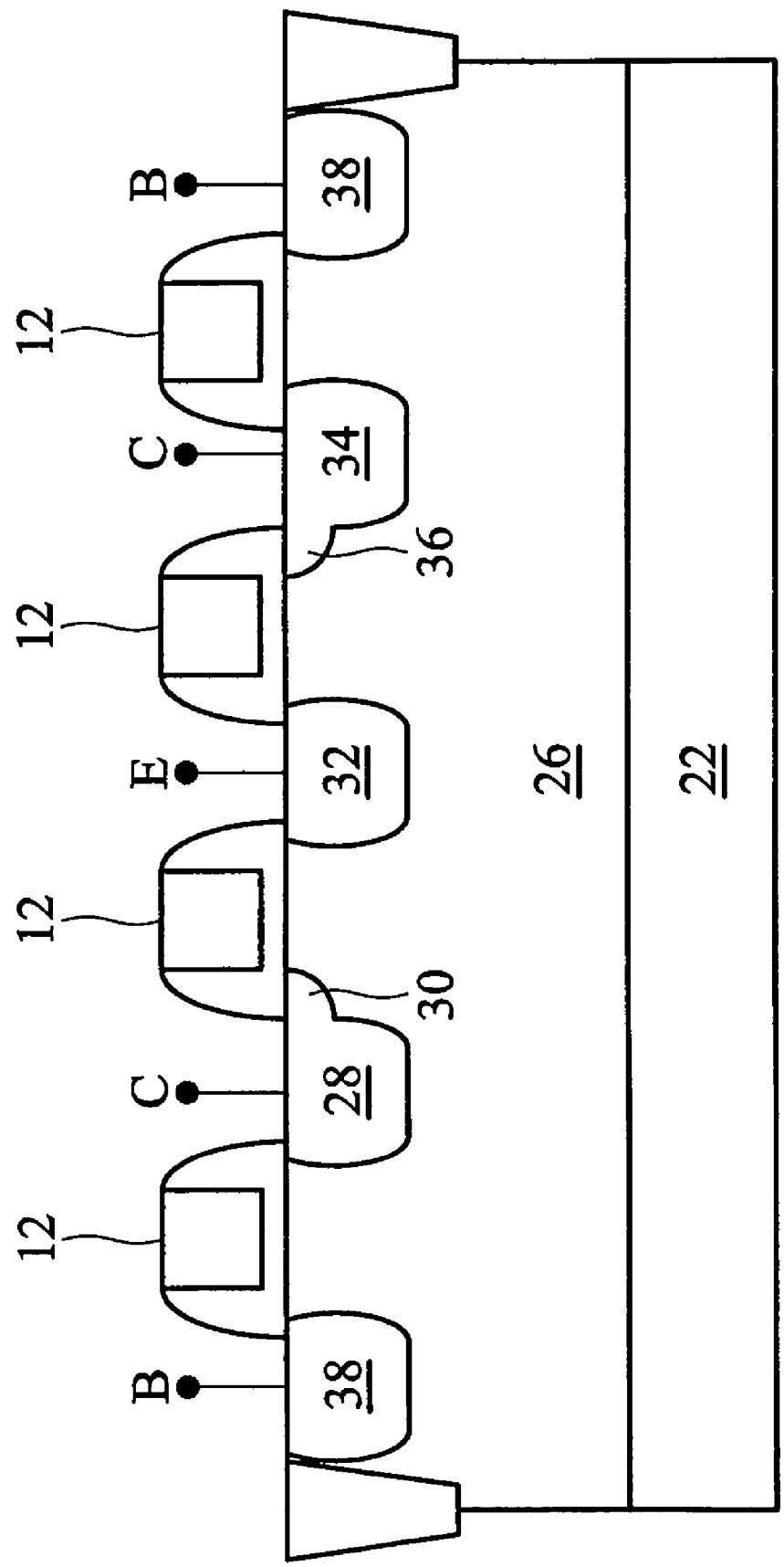
FIGS. 4 through 7 are cross-sectional views of intermediate stages in the manufacture of an embodiment of the present invention.

FIG. 4 illustrates a cross-sectional view of a PNP LBJT, wherein the cross-sectional view may be taken along a line A-A' in FIG. 3B. However, the cross-sectional view may be obtained from other embodiments of the present invention, such as FIGS. 8A through 9. Substrate 22 preferably comprises a semiconductor material such as silicon or SiGe, and is preferably doped with a p-type impurity, although an n-type substrate can also be used. An n-well 26 is formed on substrate 22. The PNP LBJT includes collectors 28 and 34 and an emitter 32 therebetween. Collectors 28 and 34 and an emitter 32 are doped with p-type impurities. The base region of the BJT includes n-well region 26 and base contact regions 38, which are n-type doped.

Emitter 32 and collectors 28 and 34 are preferably formed simultaneously with the formation of P+ source/drain regions of CMOS devices, while base contacts 38 are preferably formed simultaneously with the formation of N+ source/drain regions of CMOS devices. The collectors 28 and 34 preferably further include collector extensions, such as collector extensions 30 and 36, which are preferably similar to lightly-doped source/drain (LDD) regions of CMOS devices. Collector extensions 30 and 36 may be formed simultaneously with the formation of LDD regions in CMOS devices for input/output (I/O) circuits. Preferably, collector extensions 30 and 36 are formed only on the side of the respective collector facing emitter 32, but not facing base contact regions 38. Therefore, only one collector extension 30 is formed on one side, while on an opposite side, there is no collector extension formed. Similarly, only collector extension 36 is formed adjoining collector 34 on a side facing emitter 32. There are no pocket regions formed adjacent collector extensions 30 and 36, wherein pocket regions are regions having an opposite conductivity type than the respective collector extensions.

Emitter 32 does not have extension regions. Furthermore, there is no pocket region formed in base region 26 (n-well 26) adjacent emitter 32.

Figure 5:
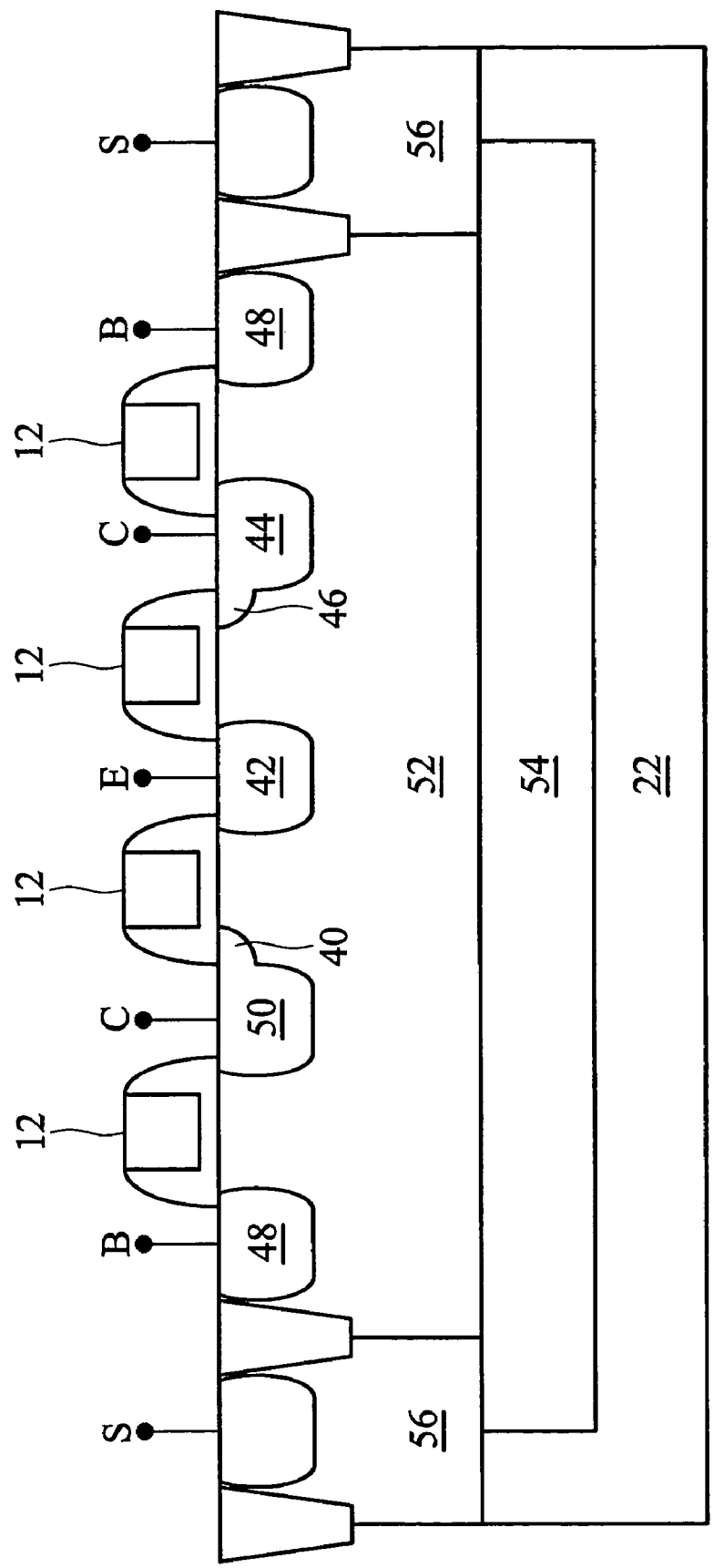

FIG. 5 illustrates a cross-sectional view of a NPN LBJT. The structure of collectors 50 and 44 (and collector extensions 40 and 46), emitter 42, and base contacts 48 are similar to the respective components illustrated in FIG. 4, except the conductivity types of the collectors (and collector extensions), emitter, and base contacts are reversed. The base region includes a p-well region 52. A deep n-well (DNW) region 54 and two n-wells 56 are formed to isolate the PNP LBJT from the underlying p-type substrate 22. Contacts S in FIG. 5 provide electrical contacts to the two n-wells 56. Again, collector extensions 40 and 46 are formed only on the sides of collectors facing emitter 42. There are no pocket regions formed adjacent collector extensions 40 and 46. Emitter 42 does not have extension regions. Furthermore, there are no pocket regions formed in base region 52 (n-well 52) and adjacent emitter 42.

Figure 6:
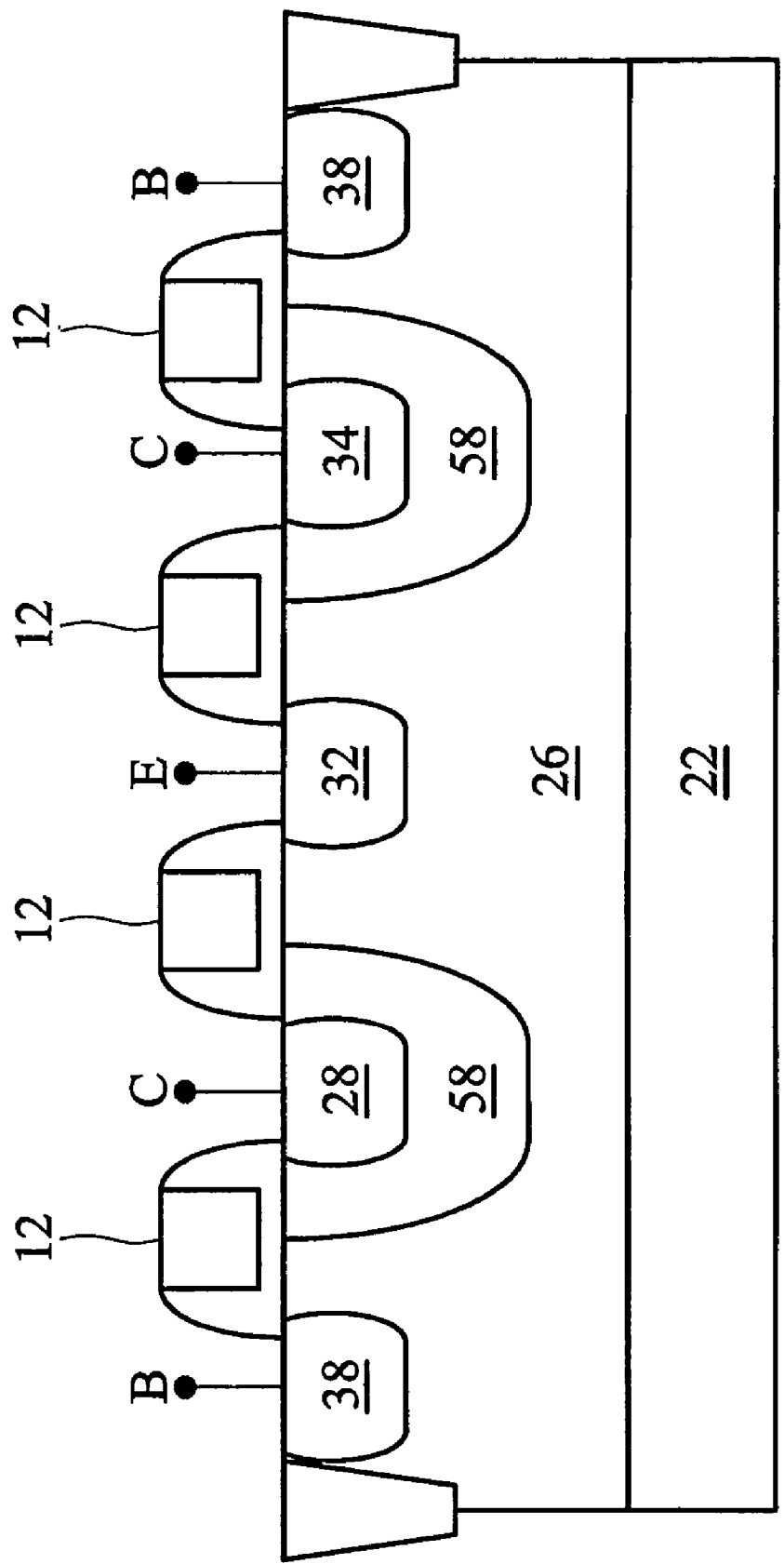

FIG. 6 illustrates a cross-sectional view of an additional PNP LBJT. The structure is similar to the embodiment shown in FIG. 4, except the collector extension regions 30 and 36 are omitted, while p-well regions 58 are formed to enclose collectors 28 and 34. In addition, there are no pocket regions formed adjacent any of the collectors 28 and 34, base contacts 38 and emitter 32.

Figure 7:
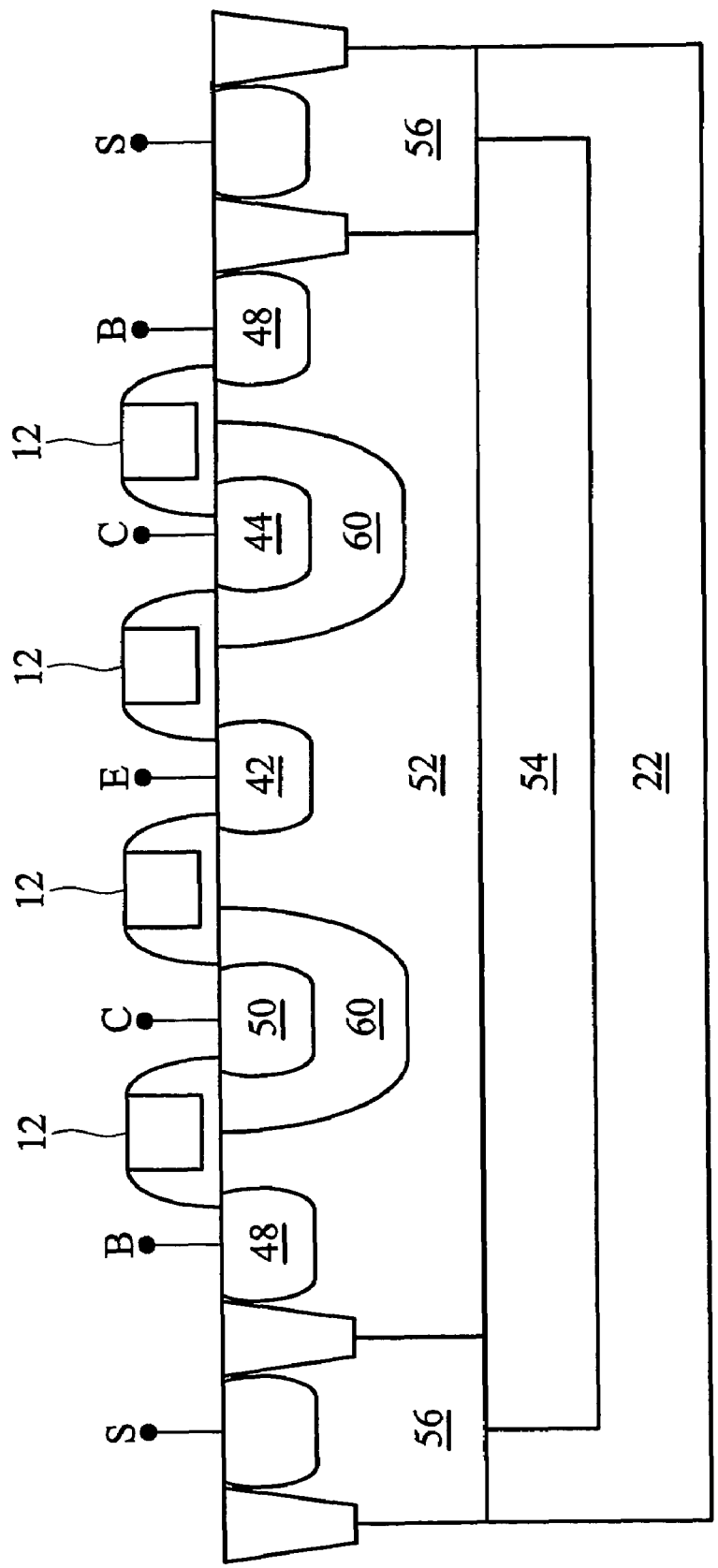

FIG. 7 illustrates a cross-sectional view of an additional NPN LBJT. The structure is similar to the embodiment shown in FIG. 5, except the collector extension regions 40 and 46 are omitted, while n-well regions 60 are formed to enclose collectors 44 and 50. There are no pocket regions formed adjacent any of the collectors 44 and 50, base contacts 48 and emitter 42. Contacts S in FIG. 7 provide electrical contacts to the two n-wells 56, as in FIG. 5.

In each of the FIGS. 4, 5, 6 and 7, gate polysilicon 12 are formed, which is preferably doped, and a voltage can be applied thereon to change the characteristics of the resulting BJT. A top view (refer to FIG. 2A) shows that the polysilicon strips 12 form an interconnected polysilicon net. Alternatively, in the embodiments as illustrated in FIGS. 4 through 7, resist protective oxide strips may be formed in the places of the polysilicon strips 12. In this case, a dielectric layer underlying polysilicon strips 12 may be omitted.

Figure 8A:
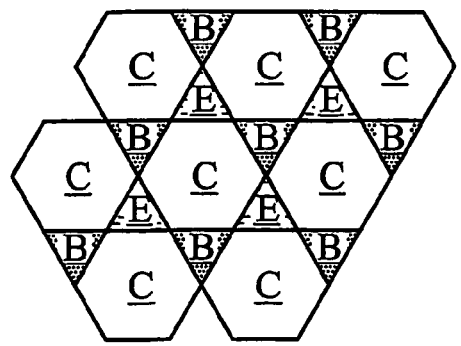
FIGS. 8A through 8C are layouts of array-type BJTs.
Figure 8B:
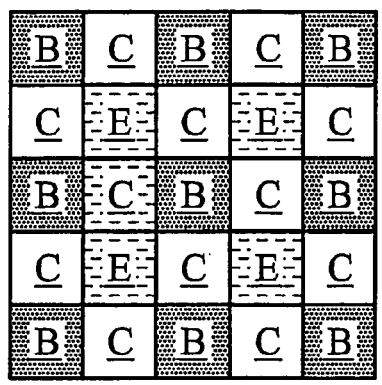
Figure 8C:
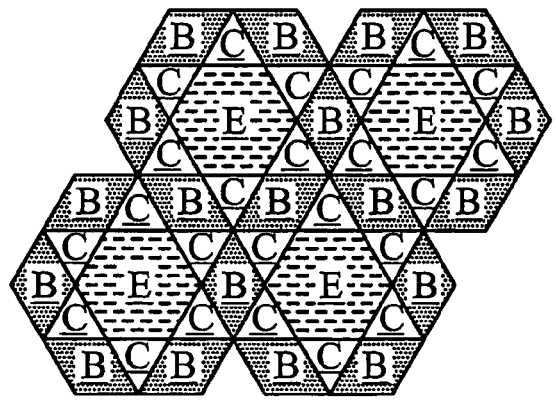

In the preferred embodiment of the present invention, the unit cell of the LBJT is repeatable and can be arranged as an array. FIGS. 8A, 8B and 8C illustrate the layout of 2 by 2 arrays. In each of the arrays, since there are four emitters arranged as a 2 by 2 array, the entire structure is considered as an array-type LBJT, with each emitter and the respective surrounding collectors and bases treated as one unit LBJT cell. Preferably, all four emitters E are interconnected as one. All the base contacts B are interconnected as one, and all the collectors C are interconnected as one. Therefore, the array is equivalent to one LBJT.

A BJT comprising an array of small BJTs is advantageous over one big BJT. As is commonly known, when one region is divided into sub regions, the total area does not change, while the total perimeter increases. Accordingly, compared to an LBJT occupying the same chip area but having only one base, one emitter and one collector, the preferred embodiments of the present invention have a maximized total area in the path between the collectors and the emitters, while the total area of the emitters is not increased. Meanwhile, the emitter/base has a minimized interface area.

Generally, an LBJT may be designed with different numbers of rows and columns according to design requirements. Preferably, in each unit cell of the array, the emitter has a minimized area, which is preferably determined by the minimum width allowed by the existing technology, and the LBJT preferably has more unit cells for improved performance.

Although the preferred embodiments provide a method of forming NPN LBJTs, one skilled in the art will realize that the teaching provided is readily available for the formation of PNP LBJTs, with the types of the respective emitters, collectors, bases and well regions inverted.

FIG. 9 illustrates a variation of the preferred embodiment, wherein a base B is separated from an emitter E by a collector C. An advantageous feature of this embodiment is that the base resistance can be adjusted by adjusting the distance between the base B and the emitter E.

Sample LBJT devices were formed using the preferred embodiment of the present invention, wherein the sample devices have a structure similar to what is shown in FIG. 8B except that the sample devices are in the form of 3 by 3 arrays. The polysilicon width D (refer to FIG. 2A) is about 0.25 μm, the emitter width W is about 0.28 μm, and the emitter length is about 0.4 μm.

Figure 10:
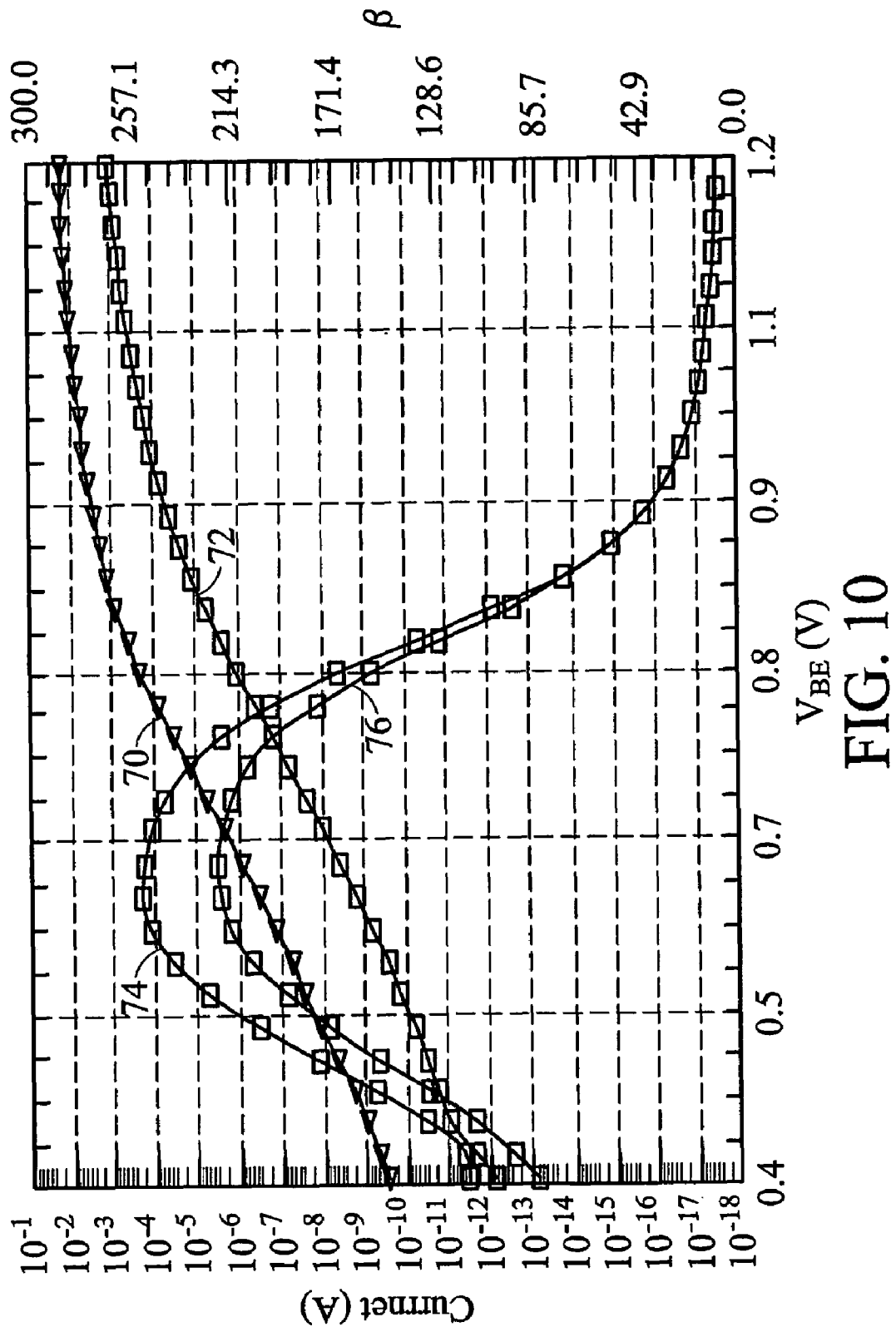
FIGS. 10 through 12 illustrate Gummel plots of sample devices.
Figure 11:
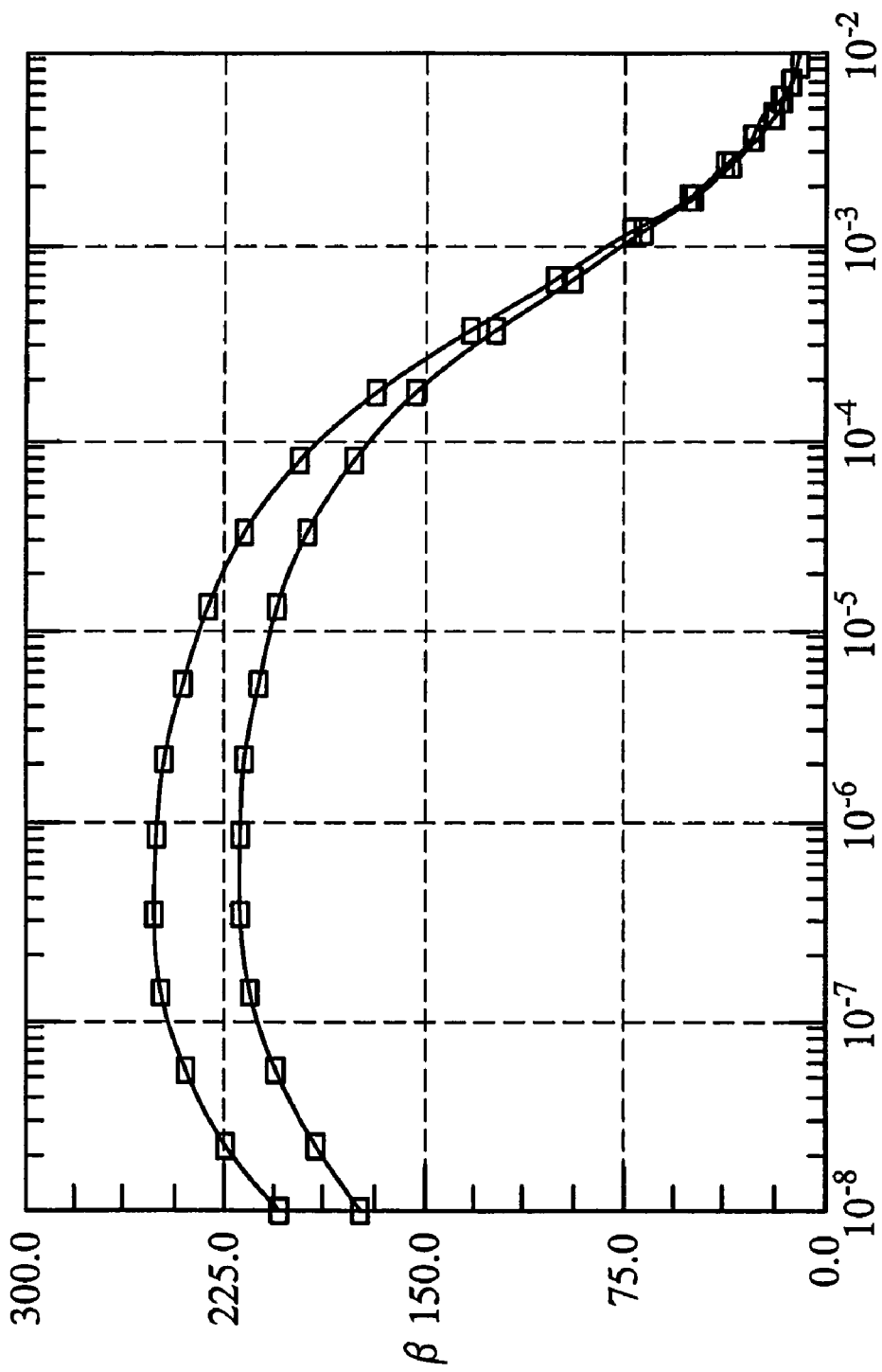

The Gummel plots of the sample LBJT devices are shown in FIGS. 10 and 11. In FIG. 10, the X-axis indicates the emitter voltages $V_{BE}$ between base contact and emitter. The Y-axis on the left side of the plot indicates collector currents and base currents, which are shown as lines 70 and 72, respectively. It is noted that the lines 70 and 72 are substantially linear in a wide emitter voltage $V_E$ range, such as from about 0.4V to about 0.8V. The Y-axis on the right side of the plot indicates β values, which is the current gain and equals the collector current divided by the base current. From lines 74 and 76, it is found that the β values are high when the emitter current ranges between about 0.4V and about 0.8V. The line 74 and 76 represent bias voltages $V_{CB}$ of 1V and 0V, respectively.

FIG. 11 illustrates the β value as a function of the collector current $I_C$. The plot shows that the β values may reach as high as 251 and remain high when the collector current $I_C$ ranges from about $10^{-8}$A to about $10^{-4}$A. The results shown in FIGS. 10 and 11 have proved that the devices formed using the preferred embodiment of the present invention have high gains in wide current and voltage ranges.

Figure 12:
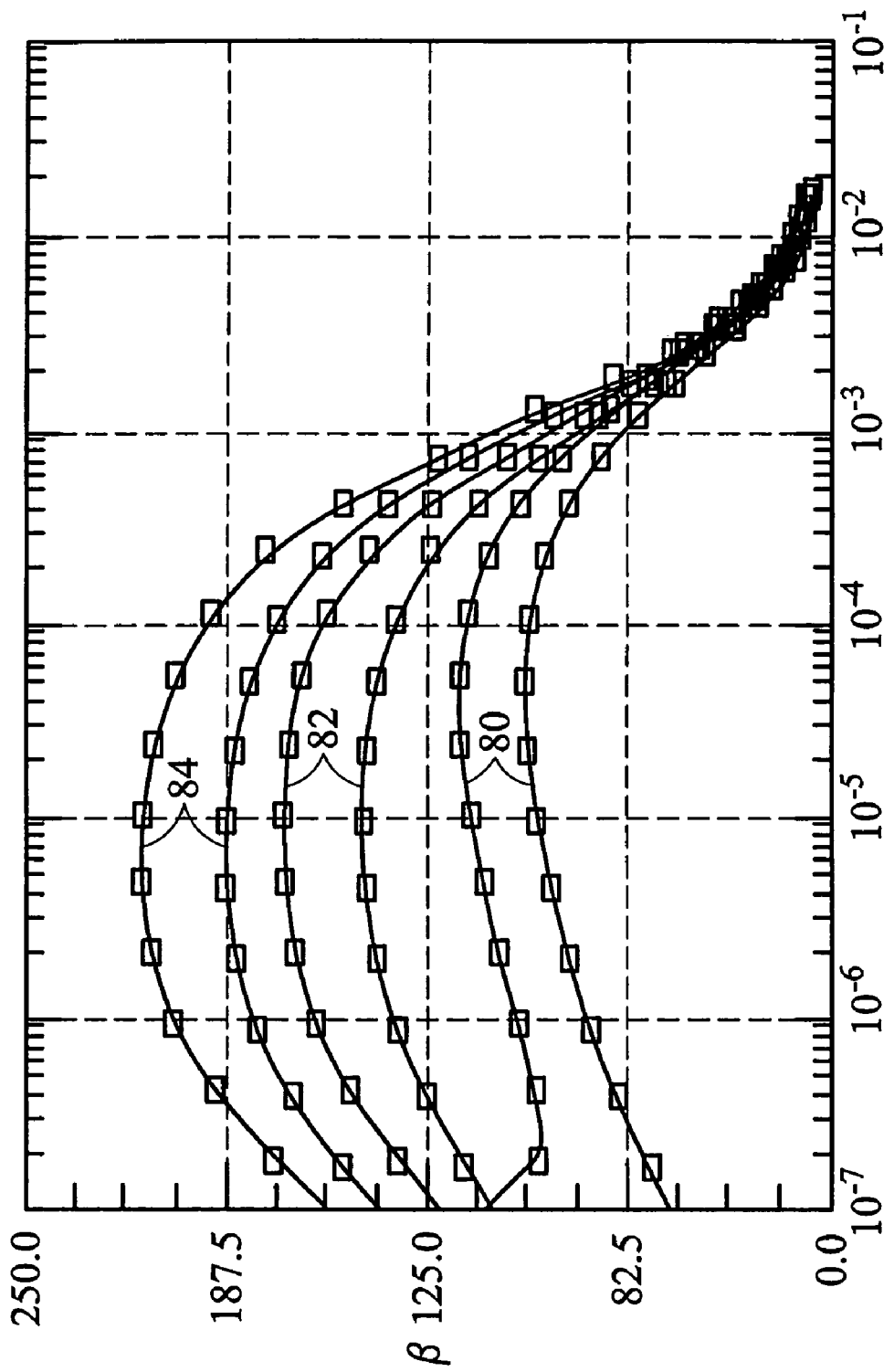

FIG. 12 illustrates a comparison of Gummel plots of three samples, wherein the X-axis and Y-axis are the same as shown in FIG. 10. Lines 80 are obtained from a first NPN BJT sample, wherein all collectors, base contacts and emitters are formed simultaneously with the formation of core CMOS devices. Pocket regions and LDD regions are formed for collectors, base contacts and emitters for the first NPN BJT sample. Lines 82 are obtained from a second NPN BJT sample, wherein no pocket regions and LDD regions are formed adjacent any of the collectors, base contacts and emitter for the second NPN BJT sample. Lines 84 are formed from a third NPN BJT sample having a structure shown in FIG. 4. It is noted that the third sample has significantly higher β values than the first and the second samples.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A lateral bipolar junction transistor comprising:
   a well region of a first conductivity type formed over a substrate;
   an emitter in the well region, wherein the emitter is a doped region formed of a second conductivity type opposite the first conductivity type, and wherein the emitter has a polygon shape with a plurality of sides;
   a plurality of collectors of the second conductivity type, each of the collectors being disposed as a separate doped region formed in the well region, the plurality of collectors being electrically interconnected to each other, wherein each one of the plurality of sides of the emitter has one of the plurality of collectors adjacent and substantially aligned with one of the collectors, each of the doped regions forming the collectors being separated from each other by the well region;
   a plurality of base contacts of the first conductivity type formed as doped regions in the well region and electrically interconnected to each other, wherein each of the base contacts are adjacent one or more of the collectors, and wherein none of the base contacts are adjacent or substantially aligned with a side of the emitter; and
   wherein the well region is interposed between the doped region forming the emitter and neighboring doped regions forming collectors and the well region is interposed between the doped region forming the emitter and neighboring doped regions forming base contacts.

2. The lateral bipolar junction transistor of claim 1, wherein the well region interposed between the doped regions has a width substantially close to a critical dimension.

3. The lateral bipolar junction transistor of claim 1 further comprising a dielectric layer over the well region interposed between the doped regions, and a polysilicon on the dielectric layer.

4. The lateral bipolar junction transistor of claim 1 further comprising a resist protective oxide over the well region interposed between the doped regions.

5. The lateral bipolar junction transistor of claim 1, wherein the emitter has a length or a width substantially close to a critical dimension.

6. The lateral bipolar junction transistor of claim 1, wherein the emitter, the collectors and the base contacts are squares.

7. The lateral bipolar junction transistor of claim 1, wherein the emitter has a triangular shape, the collectors have a hexagonal shape and the base contacts have a triangular shape.

8. The lateral bipolar junction transistor of claim 1, wherein the emitter has a hexagonal shape, the collectors have a triangular shape and the base contacts have a diamond shape.

9. The lateral bipolar junction transistor of claim 1 further comprising additional emitters formed as doped regions separated one from another and from the collectors and the base contacts, wherein the emitter and the additional emitters are arranged as an array and are electrically interconnected.

10. The lateral bipolar junction transistor of claim 1, wherein each of the collectors further comprises a collector extension on a first side of the collector facing the emitter, wherein a second side opposite the first side is free from a collector extension.

11. The lateral bipolar junction transistor of claim 10, wherein at least one of the collector extensions has a same dopant and a same depth as a LDD region of an input/output (I/O) MOS device.

12. The lateral bipolar junction transistor of claim 1, wherein the doped regions forming the emitter, the collectors and the base contacts are free from adjacent pocket regions in the well region.

13. A lateral bipolar junction transistor comprising:
   a well region of a first conductivity type formed over a substrate;
   doped regions forming at least one emitter of a second conductivity type opposite the first conductivity type in the well region, wherein each of the at least one emitters are electrically interconnected;
   a plurality of doped regions forming collectors of the second conductivity type in the well region, wherein the plurality of collectors are electrically interconnected to each other, wherein a portion of the well region is interposed between neighboring ones of the plurality of doped regions forming the collectors;
   a plurality of doped regions forming base contacts of the first conductivity type in the well region, wherein the base contacts are electrically interconnected to each other, wherein a portion of the well region is interposed between neighboring ones of the plurality of doped regions forming base contacts;

wherein each of the at least one emitters is surrounded by the collectors, and none of the base contacts are adjacent a side of the at least one emitter; and wherein each of the at least one emitters and neighboring collectors are separated one from another by a portion of the well region, and further wherein the collectors and neighboring base contacts are separated one from another by a portion of the well region.

14. The lateral bipolar junction transistor of claim 13, wherein the first conductivity type is N-type and the second conductivity type is P-type.

15. The lateral bipolar junction transistor of claim 13, wherein the first conductivity type is P-type and the second conductivity type is N-type.

16. The lateral bipolar junction transistor of claim 13, wherein the at least one emitter, the base contacts and the collectors are polygons.

17. The lateral bipolar junction transistor of claim 13, wherein the at least one emitter, the collectors and the base contacts have irregular shapes.

18. The lateral bipolar junction transistor of claim 13, wherein an emitter is separated from a nearest base contact by a collector.

19. An array-shaped lateral bipolar junction transistor comprising:

a well region of a first conductivity type formed over a substrate;

a plurality of doped regions forming emitters of a second conductivity type opposite the first conductivity type in the well region, wherein each of the emitters has a polygon shape with a plurality of sides and wherein the emitters are arranged in rows and columns and are electrically interconnected;

a plurality of doped regions forming collectors of the second conductivity type in the well region, wherein the collectors are electrically interconnected and wherein each of the doped regions forming the collectors is a separate doped region from the other doped regions forming collectors;

a plurality of doped regions forming base contacts of the first conductivity type in the well region, wherein the base contacts are interconnected to each other and wherein each of the doped regions forming base contacts is a separate doped region from the other doped regions forming base contacts;

wherein all sides of each of the emitters are adjacent the collectors and are not adjacent the base contacts; and wherein neighboring emitters, collectors and base contacts are separated one from another by respective portions of the well region.

20. The array-shaped lateral bipolar junction transistor of claim 19, wherein a portion of the collectors are adjacent more than one of the emitters.

* * * * *